(12) United States Patent
Owa et al.

(10) Patent No.: US 6,844,915 B2
(45) Date of Patent: Jan. 18, 2005

(54) OPTICAL SYSTEM AND EXPOSURE APPARATUS PROVIDED WITH THE OPTICAL SYSTEM

(75) Inventors: Soichi Owa, Kumagaya (JP); Naomasa Shiraishi, Saitama (JP); Issey Tanaka, Hadogaya (JP); Yasuhiro Omura, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/207,109

(22) Filed: Jul. 30, 2002

(65) Prior Publication Data

US 2003/0025894 A1 Feb. 6, 2003

Related U.S. Application Data

(60) Provisional application No. 60/308,844, filed on Aug. 1, 2001.

(51) Int. Cl.[7] .................. G03B 27/42; G02B 13/14; G02B 9/00
(52) U.S. Cl. .................. 355/53; 359/497; 359/754
(58) Field of Search .................. 355/53, 67; 359/355, 359/497, 499, 754

(56) References Cited

U.S. PATENT DOCUMENTS

| | | | | |
|---|---|---|---|---|
| 5,969,802 | A | * 10/1999 | Takahashi et al. | ............ 355/67 |
| 6,122,107 | A | * 9/2000 | Koch et al. | .................. 359/618 |
| 6,137,626 | A | 10/2000 | Takaoka | |

(List continued on next page.)

FOREIGN PATENT DOCUMENTS

| | | |
|---|---|---|
| EP | 1 063 684 A1 | 12/2000 |
| EP | 1 114 802 A1 | 7/2001 |
| JP | A-8-107060 | 4/1996 |
| JP | A-11-54411 | 2/1999 |
| JP | A-2000-331927 | 11/2000 |
| JP | 2000-331927 | 11/2002 |
| WO | WO 02/093209 A2 | 11/2002 |
| WO | WO 02/093257 A2 | 11/2002 |
| WO | WO 03/009021 A1 | 1/2003 |
| WO | WO 03/009062 A1 | 1/2003 |

OTHER PUBLICATIONS

Birefringence of CaF2, Kurt Nattermann, International SEMA Tech Calcium Fluoride Birefringence Work Shop, Jul. 2001.
Intrinsic birefringence in calcium fluoride and barium fluoride, Physical Review B, vol. 64, 241102(R), John H. Burnett et al., Nov. 29, 2001.
English–language translation of JP–A–11–54411.
Burnett et al., "Intrinsic Birefringence in 157 nm Materials", $2^{nd}$ International Symposium, National Institute of Standards and Technology, 2001.

*Primary Examiner*—Alan Mathews
(74) *Attorney, Agent, or Firm*—Oliff & Berridge PLC

(57) ABSTRACT

An optical system attains good optical performance without substantially receiving the effects of birefringence even when using an optical material having intrinsic birefringence. An optical system that includes at least one radiation transmissive member that transmits light having a wavelength of 200 nm or less has an optical axis that substantially coincides with a crystal axis [100] or a crystal axis optically equivalent to the crystal axis [100]. In addition, an optical system can include: a first group of radiation transmissive members that transmits light having a wavelength of 200 nm or less and having an optical axis that substantially coincides with a crystal axis [100] or a crystal axis optically equivalent to the crystal axis [100]; and a second group of radiation transmissive members that transmits light having a wavelength of 200 nm or less and having an optical axis that substantially coincides with a crystal axis [100] or a crystal axis optically equivalent to the crystal axis [100]; wherein the first group of radiation transmissive members and the second group of radiation transmissive members have a positional relationship rotated substantially 45° about the optical axis relative to each other.

8 Claims, 8 Drawing Sheets

U.S. PATENT DOCUMENTS

| | | |
|---|---|---|
| 6,195,213 B1 * | 2/2001 | Omura et al. ............... 359/727 |
| 6,201,634 B1 | 3/2001 | Sakuma et al. |
| 6,366,404 B1 | 4/2002 | Hiraiwa et al. |
| 2003/0000453 A1 | 1/2003 | Unno et al. |
| 2003/0011893 A1 | 1/2003 | Shiraishi et al. |
| 2003/0011896 A1 | 1/2003 | Shiraishi |
| 2003/0012724 A1 | 1/2003 | Burnett et al. |
| 2003/0021026 A1 | 1/2003 | Allan et al. |
| 2003/0053036 A1 | 3/2003 | Fujishima et al. |
| 2003/0058421 A1 | 3/2003 | Omura et al. |
| 2003/0099047 A1 * | 5/2003 | Hoffman et al. ............ 359/754 |

* cited by examiner

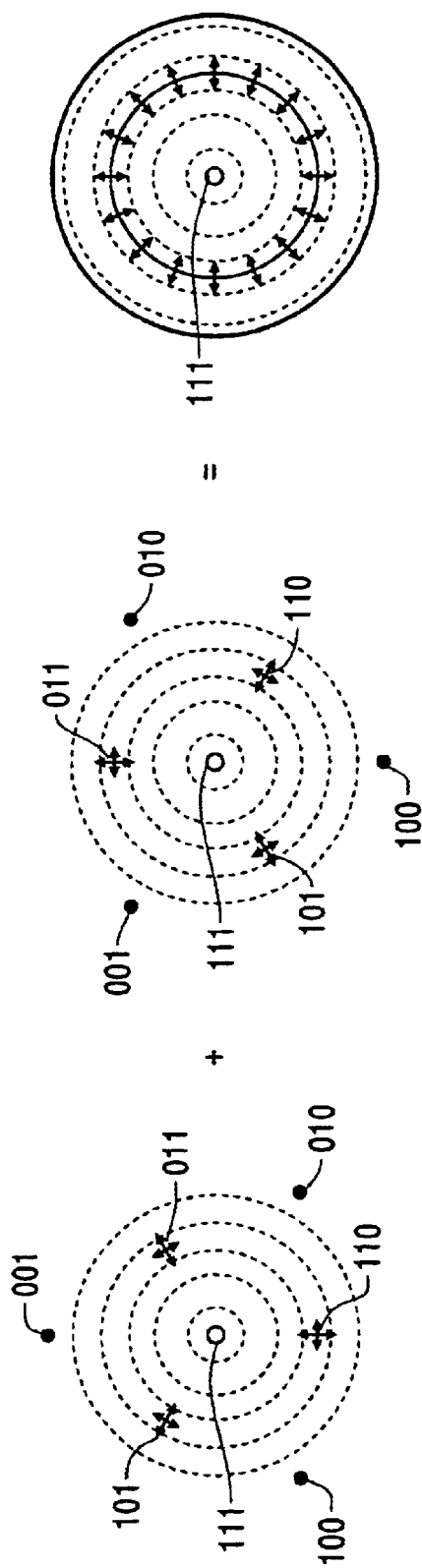

OPTICAL SYSTEM AND EXPOSURE APPARATUS PROVIDED WITH THE OPTICAL SYSTEM

This non-provisional application claims the benefit of U.S. Provisional Application No. 60/308,844 filed Aug. 1, 2001. The disclosure of Japanese Application No. 2001-162386 filed May 30, 2001, is incorporated herein by reference in its entirety.

BACKGROUND OF THE INVENTION

1. Field of Invention

The present invention relates to an optical system and an exposure apparatus provided with the optical system, and more particularly relates to a projection optical system suitable for an exposure apparatus used to fabricate microdevices such as semiconductor devices using a photolithography process.

2. Description of Related Art

In recent years, considerable progress has been made in making linewidths finer when fabricating semiconductor devices or liquid crystal display devices, and the need has arisen for projection optical systems of greater resolution in exposure apparatus that form the patterns. In order to satisfy this need for higher resolution, it is necessary to shorten the wavelength of the exposing light and also enlarge the NA (numerical aperture) of the projection optical system. However, when the wavelength of the exposing radiation (light) becomes short, there are limitations on the type of optical glass that can be used due to light absorption.

For example, when light in the vacuum ultraviolet region having a wavelength of 200 nm or less, particularly $F_2$ laser light (157 nm wavelength), is used as exposure light, it is necessary to make abundant use of fluoride crystals such as calcium fluoride (fluorite: $CaF_2$) or barium fluoride ($BaF_2$) as the radiation transmissive optical material comprising the projection optical system. In actuality, designs exist specifically for making a projection optical system out of fluorite alone in an exposure apparatus that uses $F_2$ laser light as the exposing light. Fluorite is a cubic (isometric) system, is optically isotropic and was thought to have effectively no birefringence. In addition, in experiments in the conventional visible light wavelength range, only a small birefringence (a random phenomenon caused by internal stress) was observed in fluorite.

However, at the 2nd International Symposium on 157 nm Lithography held on May 15, 2001, John H. Burnett, et. al, of the U.S. National Institute of Standards and Technology announced that they had confirmed both experimentally and theoretically the existence of intrinsic birefringence in fluorite.

According to this announcement, birefringence in fluorite is essentially zero in the direction of the crystal axis [111] and in the direction of its optically equivalent crystal axes [-111], [1-11] and [11-1], and in the direction of the crystal axis [100] and in the direction of its optically equivalent crystal axes [010] and [001], but has a substantially nonzero value in other directions. In particular, in the six directions of the crystal axes [110], [-110], [101], [-101], [011] and [01-1], fluorite has a birefringence of up to 6.5 nm/cm for the 157 nm wavelength and up to 3.6 nm/cm for the 193 nm wavelength. These birefringence values are effectively larger than the 1 nm/cm permissible value for random birefringence. Moreover, there is a possibility that the effects of birefringence could add up from the nonrandom portion passing through multiple lenses.

In the prior art, the birefringence of fluorite is not taken into consideration in the design of projection optical systems, and in general the crystal axis [111] is made to coincide with the optical axis from the standpoint of ease in processing. In this case, the NA (numerical aperture) is relatively large in the projection optical system, and consequently light beams with a certain degree of inclination from the crystal axis [111] pass through the lenses. As a result, it is possible that the imaging performance could deteriorate due to the effects of birefringence.

However, in the aforementioned announcement by Burnett et al., a method was disclosed for correcting the effects of birefringence by having the optical axes and crystal axes [111] of a pair of fluorite lenses coincide, and rotating the pair of fluorite lenses 60° relative to each other about the optical axis. However, with this method, although it is possible to mitigate the effects of birefringence to a certain extent, as noted above this does not positively correct for the effects of birefringence in the direction opposite to this. As a result, the correction efficacy is inadequate.

SUMMARY OF THE INVENTION

In consideration of the foregoing, it is an object of the present invention to provide an optical system having a good optical performance and substantially not receiving the effects of birefringence even if an optical material having an intrinsic birefringence is used, such as fluorite for example, and to provide an exposure apparatus equipped with the optical system.

In order to achieve an object of the present invention, a first aspect of the invention provides an optical system having at least one radiation transmissive member that transmits light having a wavelength of 200 nm or less and in which the optical axis substantially coincides with a crystal axis [100] or a crystal axis optically equivalent to the crystal axis [100].

A second aspect of the invention provides an optical system having: a first group of radiation transmissive members that transmits light having a wavelength of 200 nm or less and in which the optical axis substantially coincides with a crystal axis [100] or a crystal axis optically equivalent to the crystal axis [100], and a second group of radiation transmissive members that transmits light having a wavelength of 200 nm or less and in which the optical axis substantially coincides with a crystal axis [100] or a crystal axis optically equivalent to the crystal axis [100]; wherein the first group of radiation transmissive members and the second group of radiation transmissive members have a positional relationship rotated substantially 45° about the optical axis relative to each other.

In a preferred embodiment of the second aspect of the invention, the optical system is further provided with a third group of radiation transmissive members that transmits light having a wavelength of 200 nm or less and in which the optical axis substantially coincides with a crystal axis [111] or a crystal axis optically equivalent to the crystal axis [111], and a fourth group of radiation transmissive members that transmits light having a wavelength of 200 nm or less and in which the optical axis substantially coincides with a crystal axis [111] or a crystal axis optically equivalent to the crystal axis [111]; wherein the third group of radiation transmissive members and the fourth group of radiation transmissive members have a positional relationship rotated substantially 60° about the optical axis relative to each other.

In addition it is preferable for the optical system to be further provided with a fifth group of radiation transmissive members that transmits light having a wavelength of 200 nm or less and in which the optical axis substantially coincides with a crystal axis [110] or a crystal axis optically equivalent to the crystal axis [110], and a sixth group of radiation transmissive members that transmits light having a wavelength of 200 nm or less and in which the optical axis substantially coincides with a crystal axis [110] or a crystal axis optically equivalent to the crystal axis [110]; wherein the fifth group of radiation transmissive members and the sixth group of radiation transmissive members have a positional relationship rotated substantially 90° about the optical axis relative to each other.

A third aspect of the invention provides an optical system having a fifth group of radiation transmissive members that transmits light having a wavelength of 200 nm or less and in which the optical axis substantially coincides with a crystal axis [110] or a crystal axis optically equivalent to the crystal axis [110], and a sixth group of radiation transmissive members that transmits light having a wavelength of 200 nm or less and in which the optical axis substantially coincides with a crystal axis [110] or a crystal axis optically equivalent to the crystal axis [110]; wherein the fifth group of radiation transmissive members and the sixth group of radiation transmissive members have a positional relationship rotated substantially 90° about the optical axis relative to each other.

A fourth aspect of the invention provides an optical system having at least one radiation transmissive member that transmits light having a wavelength of 200 nm or less and in which the optical axis substantially coincides with a crystal axis [100] or a crystal axis optically equivalent to the crystal axis [100]; a first group of radiation transmissive members that transmits light having a wavelength of 200 nm or less and in which the optical axis substantially coincides with a crystal axis [100] or a crystal axis optically equivalent to the crystal axis [100]; and a second group of radiation transmissive members that transmits light having a wavelength of 200 nm or less and in which the optical axis substantially coincides with a crystal axis [100] or a crystal axis optically equivalent to the crystal axis [100]; wherein the first group of radiation transmissive members and the second group of radiation transmissive members have a positional relationship rotated substantially 45° about the optical axis relative to each other.

In a preferred embodiment of the fourth aspect of the invention, the optical system is further provided with a third group of radiation transmissive members that transmits light having a wavelength of 200 nm or less and in which the optical axis substantially coincides with a crystal axis [111] or a crystal axis optically equivalent to the crystal axis [111], and a fourth group of radiation transmissive members that transmits light having a wavelength of 200 nm or less and in which the optical axis substantially coincides with a crystal axis [111] or a crystal axis optically equivalent to the crystal axis [111]; wherein the third group of radiation transmissive members and the fourth group of radiation transmissive members have a positional relationship rotated substantially 60° about the optical axis relative to each other.

A fifth aspect of the invention provides an optical system having at least one radiation transmissive member that transmits light having a wavelength of 200 nm or less and in which the optical axis substantially coincides with a crystal axis [100] or a crystal axis optically equivalent to the crystal axis [100]; a fifth group of radiation transmissive members that transmits light having a wavelength of 200 nm or less and in which the optical axis substantially coincides with a crystal axis [110] or a crystal axis optically equivalent to the crystal axis [110]; and a sixth group of radiation transmissive members that transmits light having a wavelength of 200 nm or less and in which the optical axis substantially coincides with a crystal axis [110] or a crystal axis optically equivalent to the crystal axis [110]; wherein the fifth group of radiation transmissive members and the sixth group of radiation transmissive members have a positional relationship rotated substantially 90° about the optical axis relative to each other.

A sixth aspect of the invention provides an optical system having a first group of radiation transmissive members that transmits light having a wavelength of 200 nm or less and in which the optical axis substantially coincides with a crystal axis [100] or a crystal axis optically equivalent to the crystal axis [100]; a second group of radiation transmissive members that transmits light having a wavelength of 200 nm or less and in which the optical axis substantially coincides with a crystal axis [100] or a crystal axis optically equivalent to the crystal axis [100]; a fifth group of radiation transmissive members that transmits light having a wavelength of 200 nm or less and in which the optical axis substantially coincides with a crystal axis [110] or a crystal axis optically equivalent to the crystal axis [110]; and a sixth group of radiation transmissive members that transmits light having a wavelength of 200 nm or less and in which the optical axis substantially coincides with a crystal axis [110] or a crystal axis optically equivalent to the crystal axis [110]; wherein the first group of radiation transmissive members and the second group of radiation transmissive members have a positional relationship rotated substantially 45° about the optical axis relative to each other; and the fifth group of radiation transmissive members and the sixth group of radiation transmissive members have a positional relationship rotated substantially 90° about the optical axis relative to each other.

In a preferred embodiment of the sixth aspect of the invention, the optical system is further provided with at least one radiation transmissive member that transmits light having a wavelength of 200 nm or less and in which the optical axis substantially coincides with a crystal axis [100] or a crystal axis optically equivalent to the crystal axis [100]. In addition, it is preferable for the optical system to be provided with a third group of radiation transmissive members that transmits light having a wavelength of 200 nm or less and in which the optical axis substantially coincides with a crystal axis [111] or a crystal axis optically equivalent to the crystal axis [111], and a fourth group of radiation transmissive members that transmits light having a wavelength of 200 nm or less and in which the optical axis substantially coincides with a crystal axis [111] or a crystal axis optically equivalent to the crystal axis [111]; wherein the third group of radiation transmissive members and the fourth group of radiation transmissive members have a positional relationship rotated substantially 60° about the optical axis relative to each other.

In each of the above-described aspects of the invention, it is preferable for the optical system to be such that the total sum of the thicknesses of the first group of radiation transmissive members along the optical axis and the total sum of the thicknesses of the second group of radiation transmissive members along the optical axis are substantially equal; the total sum of the thicknesses of the fifth group of radiation transmissive members along the optical axis and the total sum of the thicknesses of the sixth group of radiation transmissive members along the optical axis are substantially equal; and the total sum of the thicknesses of the third group of radiation transmissive members along the optical axis and the total sum of the thicknesses of the fourth group of radiation transmissive members along the optical axis are substantially equal. In addition, it is preferable for the optical system to have at least two negative lens elements and the at least two negative lens elements are provided with the fifth group and the sixth group of radiation transmissive members. Moreover, it is preferable for the radiation transmissive member to be made of fluorite.

A seventh aspect of the invention provides a projection optical system that projects an image of a pattern formed on a first surface onto a second surface; wherein the projection optical system is provided with the optical system of any of the first through sixth aspects of the invention. An eighth aspect of the invention provides a projection optical system provided with the optical system of the third or the fifth aspects of the invention, and which projects the image of a pattern formed on a first surface onto a second surface; wherein the projection optical system is provided with a concave mirror that forms a bi-directional optical path, and a refractive optical member positioned in the bi-directional optical path; and the refractive optical member is provided with the fifth group and the sixth group of radiation transmissive members. A ninth aspect of the invention provides an exposure apparatus, comprising an illumination system for illuminating a mask, and the optical system of any of the first through eighth aspects of the invention for forming on a photosensitive substrate the image of a pattern formed on the mask.

In the present invention, the fact that the first group of radiation transmissive members and the second group of radiation transmissive members have a positional relationship rotated substantially 45° about the optical axis relative to each other means that the relative angle about the optical axis between a predetermined crystal axis (e.g., crystal axis [010], [001], [011] or [011]) pointing in a direction differing from the optical axis in the first group of radiation transmissive members and the second group of radiation transmissive members is essentially 45°. When the crystal axis [100] coincides with the optical axis, rotational asymmetry in the effects of birefringence centered about the optical axis appear with a period of 90°, and consequently, having a positional relationship rotated substantially 45° about the optical axis relative to each other means that the members have a positional relationship rotated substantially 45°+(n*90°) about the optical axis relative to each other (where n is an integer).

In addition, in the present invention, the fact that the third group of radiation transmissive members and the fourth group of radiation transmissive members have a positional relationship rotated substantially 60° about the optical axis relative to each other means that the relative angle about the optical axis between a predetermined crystal axis (e.g., crystal axis [-111], [11-1] or [-1-11]) pointing in a direction differing from the optical axis in the third group of radiation transmissive members and the fourth group of radiation transmissive members is essentially 60°. When the crystal axis [111] coincides with the optical axis, rotational asymmetry in the effects of birefringence centered about the optical axis appear with a period of 120°, and consequently, having a positional relationship rotated substantially 60° about the optical axis relative to each other means that the members have a positional relationship rotated substantially 60°+(n*120°) about the optical axis relative to each other (where n is an integer).

Furthermore, in the present invention, the fact that the fifth group of radiation transmissive members and the sixth group of radiation transmissive members have a positional relationship rotated substantially 90° about the optical axis relative to each other means that the relative angle about the optical axis between a predetermined crystal axis (e.g., crystal axis [001], [-111], [-110] or [1-11]) pointing in a direction differing from the optical axis in the fifth group of radiation transmissive members and the sixth group of radiation transmissive members is essentially 90°. When the crystal axis [110] coincides with the optical axis, rotational asymmetry in the effects of birefringence centered about the optical axis appear with a period of 180°, and consequently, having a positional relationship rotated substantially 90° about the optical axis relative to each other means that the members have a positional relationship rotated substantially 90°+(n*180°) about the optical axis relative to each other (where n is an integer).

BRIEF DESCRIPTION OF THE DRAWINGS

The invention will be described in conjunction with the following drawings in which like reference numerals designate like elements and wherein:

FIG. 3 (FIGS. 3a–c) explains the method of Burnett et. al, and shows the distribution of indices of birefringence with respect to the angle of incidence of the light beams;

DETAILED DESCRIPTION OF PREFERRED EMBODIMENTS

Preferred exemplary embodiments of the present invention are described below with reference to the attached drawings.

Figure 1:
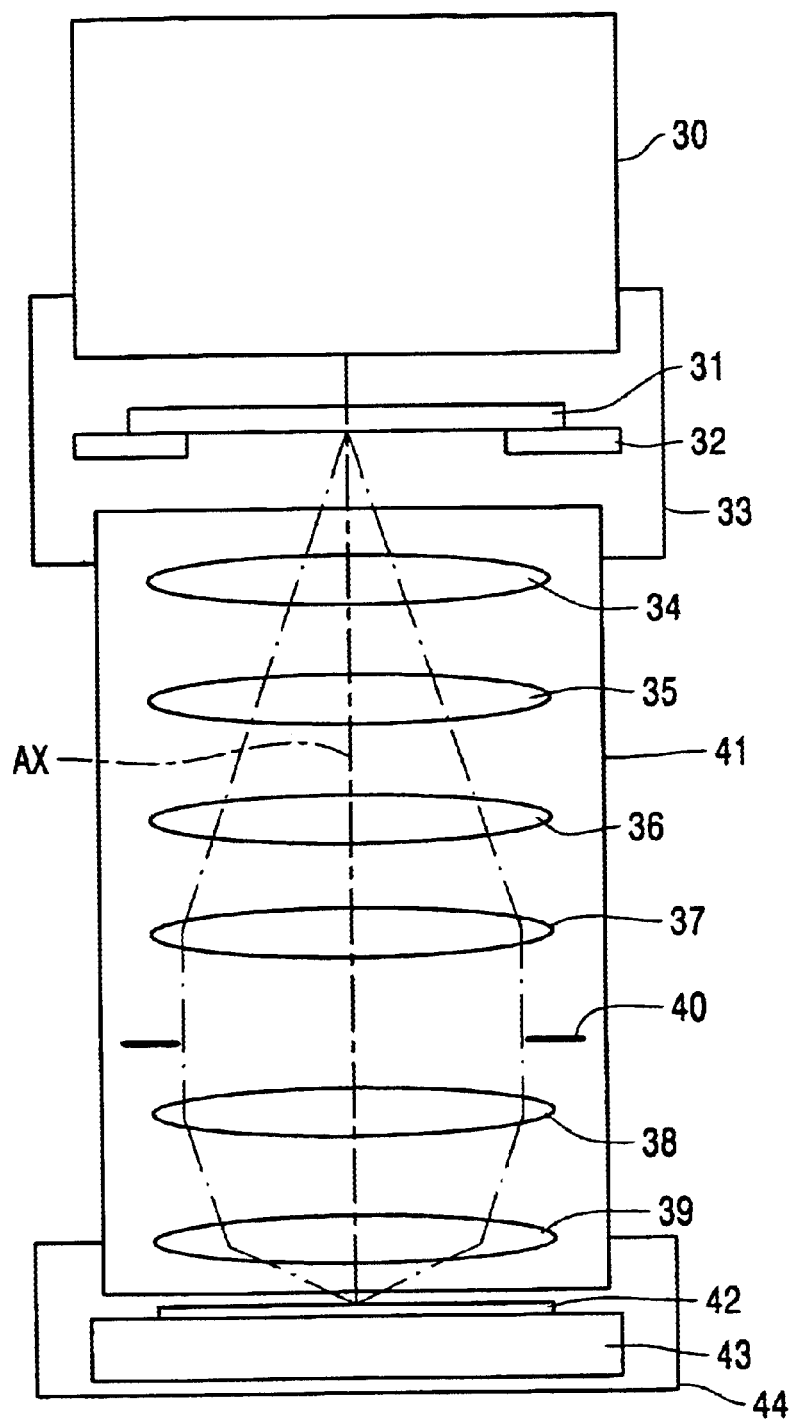
FIG. 1 is a drawing schematically showing the composition of an exposure apparatus provided with a projection optical system according to the first embodiment of the present invention.

FIG. 1 is a diagram schematically showing the composition of an exposure apparatus provided with an optical system according to a first embodiment of the present invention. In the first embodiment, the present invention is applied to a scanning projection exposure apparatus provided with a dioptric (refractive) type projection optical system. As shown in FIG. 1, the exposure apparatus of the first embodiment is provided with an illumination apparatus 30 for illuminating a reticle (mask) 31 positioned on a first surface.

The illumination apparatus 30 has a light source provided with an $F_2$ laser that supplies light having a wavelength of 157 $\mu$nm, an optical integrator that forms a secondary light source of predetermined shape (circular, annular, bipolar, quadrupolar or the like) from the light from the light source, and an illumination field aperture stop for restricting the illumination area on the reticle 31, and illuminates the illumination area on the reticle 31 with a near uniform intensity distribution.

The illumination optical path within the illumination apparatus 30 is preferably purged with an inert gas, and in the present embodiment is purged with nitrogen. The reticle 31 is mounted on a reticle stage 32, and the reticle 31 and reticle stage 32 are isolated from the outside atmosphere by a casing 33. It is preferable to purge the space inside this casing 33 with an inert gas also, and in the present embodiment this space is purged with nitrogen.

Light from the reticle 31 that has been illuminated by the illumination apparatus 30 is guided to a wafer 42, as a photosensitive substrate, via a projection optical system 41 having a plurality of lens elements 34–39 arranged along the optical axis AX and an aperture stop 40 for controlling the coherence factor (σ value), and forms an image of the pattern on the reticle 31 on the exposure area on the wafer 42. It is preferable for the projection optical path in this projection optical system 41 to be purged with an inert gas, and in the present embodiment this is purged with helium.

The wafer 42 is mounted on a wafer stage 43 such that the surface thereof is positioned on a second surface acting as the imaging surface of the projection optical system 41, and the wafer 42 and wafer stage 43 are isolated from the outside atmosphere by a casing 44. It is preferable to purge the space inside this casing 44 with an inert gas, and in the present embodiment this space is purged with nitrogen. Furthermore, the reticle stage 32 and wafer stage 43 are moved relative to the projection optical system 41 at a speed ratio in accordance with the magnification of the projection optical system 41, and the pattern on the reticle 31 is transferred to the exposure area on the wafer 42 by illuminating the reticle 31.

Figure 2:
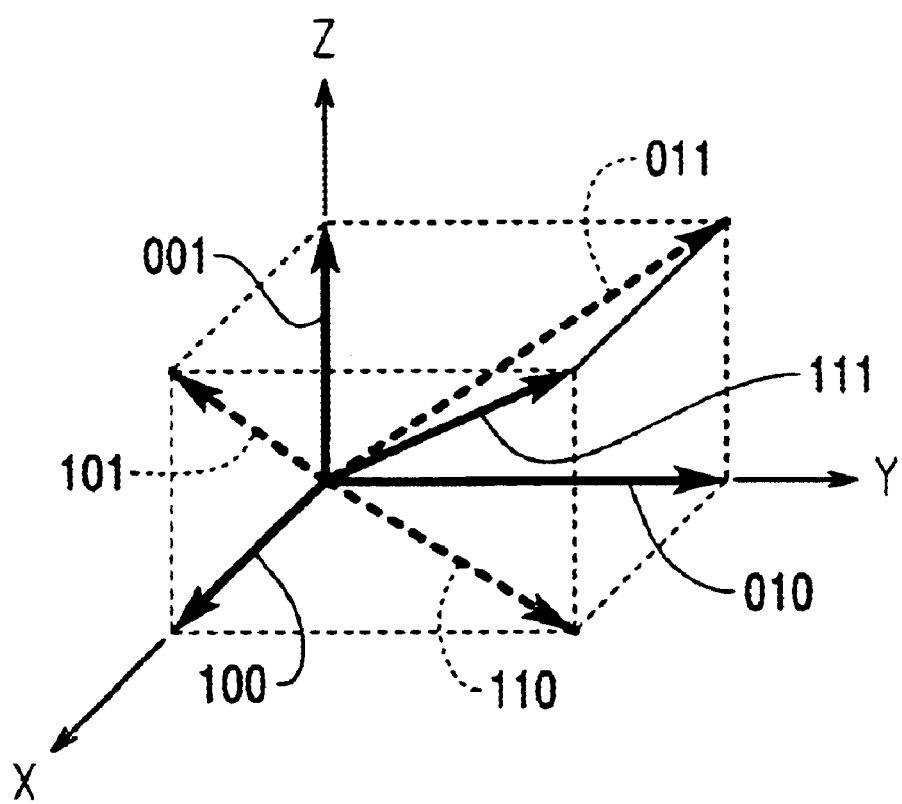
FIG. 2 is a drawing explaining the crystal axis directions in fluorite.

In the first embodiment, the plurality of lens elements 34–39 in the dioptric type projection optical system 41 are made of fluorite (calcium fluoride). FIG. 2 is a diagram explaining the crystal axis directions of the fluorite. As shown in FIG. 2, the crystal axes of the fluorite are prescribed based on the XYZ coordinate system of the cubic system. That is, the crystal axis [100] is prescribed to be along the +X axis, the crystal axis [010] along the +Y axis and the crystal axis [001] along the +Z axis.

A crystal axis [101] is prescribed in the XZ plane in a direction forming a 45° angle with the crystal axis [100] and the crystal axis [001], a crystal axis [110] is prescribed in the XY plane in a direction forming a 45° angle with the crystal axis [100] and the crystal axis [010] and a crystal axis [011] is prescribed in the YZ plane in a direction forming a 45° angle with the crystal axis [010] and the crystal axis [001]. Furthermore, a crystal axis [111] is prescribed in a direction forming an equivalent acute angle with each of the +X, +Y and +Z axes.

In FIG. 2, only the crystal axes in the space prescribed by the +X, +Y and +Z axes are shown, but crystal axes are prescribed similarly in other spaces as well. As discussed above, in fluorite, birefringence is essentially zero (minimal) on the crystal axis [111] indicated by the solid line in FIG. 2, and on the unrepresented crystal axes [-111], [1-11] and [11-1] equivalent thereto.

Similarly, birefringence is essentially zero (minimal) on the crystal axes [100], [010] and [001] indicated by solid lines in FIG. 2. On the other hand, birefringence is a maximum on the crystal axes [110], [101] and [011] indicated by broken lines in FIG. 2, and on the unrepresented crystal axes [-110], [-101] and [011] equivalent thereto.

Below, the correction efficacy of the above-described method of Burnett et. al will be verified prior to explaining the method of the present invention. FIG. 3 is a diagram explaining the method of Burnett et. al, and shows the distribution of indices of birefringence with respect to the incident angle of the light beam. In FIG. 3, the five concentric circles indicated by broken lines in the diagram show a scale of 10° per circle. Accordingly, the innermost circle shows the area of an incident angle of 10° with respect to the optical axis, and the outermost circle shows the area of an incident angle of 50° with respect to the optical axis.

In addition, the black dots indicate areas with no birefringence having a relatively high refractive index, the white dots indicate areas with no birefringence having a relatively low refractive index, and the small circle with crosshatching (see FIG. 5c) indicates the area with no birefringence having an intermediate refractive index. On the other hand, the thick circle and the long double arrows indicate the direction of relatively high refractive indices in areas having birefringence, and the thin circle and short double arrows indicate the direction of relatively low refractive indices in areas having birefringence. The above-described symbols are the same in FIGS. 4 and 5 also.

As discussed above, with the method of Burnett et. al, the crystal axis [111] and the optical axis of a pair of fluorite lenses are made to coincide, and the pair of fluorite lenses are rotated 60° relative to each other about the optical axis. Accordingly, the distribution of indices of birefringence in one of the fluorite lenses is as shown in FIG. 3a, and the distribution of indices of birefringence in the other fluorite lens is as shown in FIG. 3b. As a result, the distribution of indices of birefringence in the pair of fluorite lenses as a whole becomes as shown in FIG. 3c.

In this case, the area corresponding to the crystal axis [111] that coincides with the optical axis becomes an area of birefringence with a relatively low refractive index, as shown in FIGS. 3a and 3b. In addition, the areas corresponding to the crystal axes [100], and [001] become areas of no birefringence with relatively high refractive indices. Furthermore, the areas corresponding to the crystal axes [110], [101] and [011] become areas of birefringence with relatively low refractive indices with respect to tangential polarization and relatively high refractive indices with respect to radial polarization. Thus, in each of the individual lenses, it can be seen that the effects of birefringence are at a maximum in an area 35.26° from the optical axis (the angle formed by the crystal axis [111] and the crystal axis [110]).

On the other hand, by rotating the pair of fluorite lenses by 60° relative to each other, the effects of the crystal axes [110], [101] and [011] where birefringence is a maximum are shrunk in the pair of fluorite lenses as a whole, as shown in FIG. 3c. However, in an area 35.26° from the optical axis, that is, an area relatively close to the optical axis, there remains an area of birefringence having a lower refractive index with respect to tangential polarization than its refractive index with respect to radial polarization. As a result, with the method of Burnett et. al, it is difficult to secure adequately good imaging performance (optical performance) because the effects of birefringence will be seen to a certain extent.

As a first method in the first embodiment, out of the plurality of lens elements 34–39 in the projection optical system 41, the optical axis of a first group of lens elements is made to coincide with the crystal axis [100] (or a crystal axis optically equivalent to the crystal axis [100]), the optical axis of a second group of lens elements is made to coincide with the crystal axis [100] (or a crystal axis optically equivalent to the crystal axis [100]), and the first group of lens elements and the second group of lens elements are rotated by 45° relative to each other about the optical axis. Here, the crystal axes optically equivalent to the crystal axis [100] are the crystal axes [010] and [001].

Figure 4C:
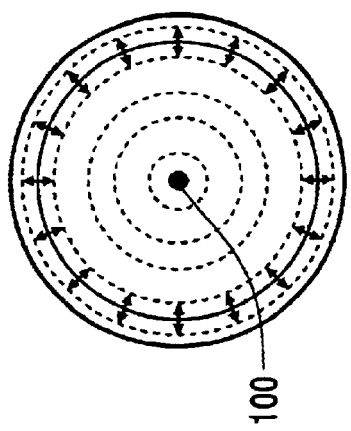
FIG. 4 (FIGS. 4a–c) explains the first method of the present invention, and shows the distribution of indices of birefringence with respect to the angle of incidence of the light beams.
Figure 4B:
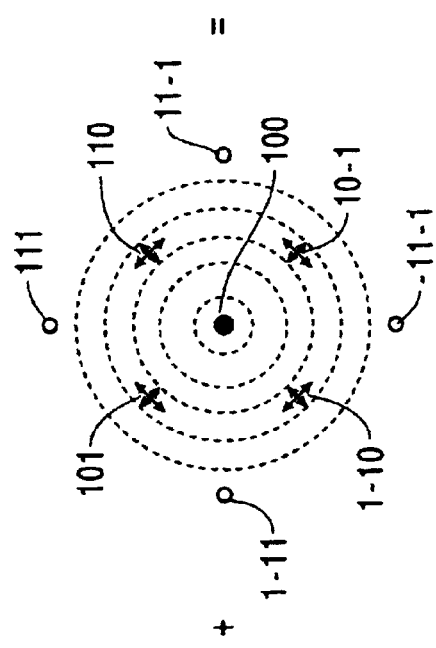
Figure 4A:
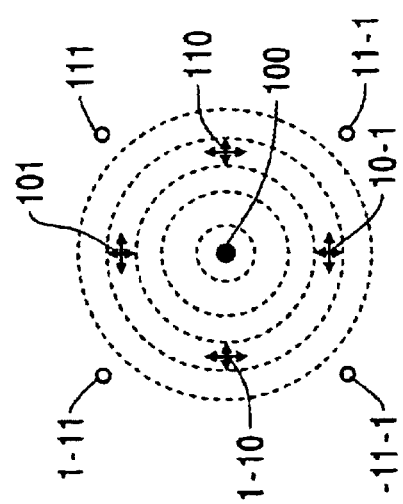

FIG. 4 is a drawing explaining the first method of the present invention, and shows the distribution of indices of birefringence with respect to the angle of incidence of the light beam. With this first method, the distribution of indices of birefringence in the first group of lens elements is as shown in FIG. 4a, and the distribution of indices of birefringence in the second group of lens elements is as shown in FIG. 4b. As a result, the distribution of indices of birefringence in the first group of lens elements and second group of lens elements together becomes as is shown in FIG. 4c.

As shown in FIGS. 4a and 4b, with this first method the area corresponding to the crystal axis [100] that coincides with the optical axis becomes an area of no birefringence with a relatively high refractive index. In addition, the areas corresponding to the crystal axes [111], [1-11], [-111] and [11-1] become areas of no birefringence with a relatively low refractive index. Furthermore, the areas corresponding to the crystal axes [101], [10-1], [110] and [110] become areas of birefringence having a relatively high refractive index with respect to tangential polarization and a relatively low refractive index with respect to radial polarization. In this way, it can be seen that in each of the lens elements the effects of birefringence are at a maximum in the area 45° from the optical axis (the angle formed by the crystal axis [100] and the crystal axis [101]).

On the other hand, as shown in FIG. 4c, by rotating the first group of lens elements and the second group of lens elements by 45° relative to each other about the optical axis, the effects of the crystal axes [101], [10-1], [110] and [1-10] where birefringence is a maximum are considerably mitigated in the first group of lens elements and the second group of lens elements as a whole, and in the area 45° from the optical axis, that is, an area separated from the optical axis, an area of birefringence remains in which the index of refraction with respect to tangential polarization is higher than the index of refraction with respect to radial polarization. In this case, the maximum angle between the optical axis and the light beam in each of the lens elements in a general projection optical system is 35-40°. Accordingly, by utilizing the first method, it is possible to attain good imaging performance and in effect receive no effects of the birefringence of the crystal axes [101], [10-1], [110] and [1-10].

In this first method of the present invention, the fact that the first group of lens elements and the second group of lens elements have a positional relationship rotated substantially 45° about the optical axis relative to each other means that the relative angle about the optical axis between a predetermined crystal axis (e.g., crystal axis [010], [001], [01-1] or [011]) pointing in a direction differing from the optical axis in the first group of lens elements and the second group of lens elements is substantially 45°. For example, the relative angle about the optical axis between the crystal axis [010] in the first group of lens elements and the crystal axis [010] in the second group of lens elements is 45°.

In addition, as can be seen from FIGS. 4a and 4b, when the crystal axis [100] coincides with the optical axis, rotational asymmetry in the effects of birefringence centered about the optical axis appears with a period of 90°. Accordingly, in this first method, having a positional relationship rotated substantially 45° relative to each other about the optical axis means that the lens elements have a positional relationship rotated substantially 45°+(n* 90°), that is to say 45°, 135°, 225°, 315°. . . , about the optical axis relative to each other (where n is an integer).

In the above explanation, the first group of lens elements and the second group of lens elements each have one or a plurality of lens elements. Furthermore, when the first group of lens elements or the second group of lens elements contains a plurality of lens elements, the plurality of lens elements need not be consecutive lens elements. The concept of a group of lens elements is the same in the third through sixth groups of lens elements below. In this first method, it is preferable that the sum of the thicknesses of the first group of lens elements along the optical axis and the sum of the thicknesses of the second group of lens elements along the optical axis be substantially equal.

However, as shown in FIGS. 3c and 4c, the direction of birefringence in the area 35.26° from the optical axis in the method of Burnett et. al and the direction of birefringence in the area 45° from the optical axis in the first method are opposite. Accordingly, by employing a second method that combines the first method with the method of Burnett et. al, it is possible to attain good imaging performance with effectively no effects of birefringence.

With the second method, out of the plurality of lens elements 34–39 in the projection optical system 41, the optical axis of the first group of lens elements is made to coincide with the crystal axis [100] (or a crystal axis optically equivalent to the crystal axis [100]), the optical axis of the second group of lens elements is made to coincide with the crystal axis [100] (or a crystal axis optically equivalent to the crystal axis [100]), and the first group of lens elements and the second group of lens elements are rotated by 45° relative to each other about the optical axis. Furthermore, the optical axis of a third group of lens elements is made to coincide with the crystal axis [111] (or a crystal axis optically equivalent to the crystal axis [111]), the optical axis of a fourth group of lens elements is made to coincide with the crystal axis [111] (or a crystal axis optically equivalent to the crystal axis [111]), and the third group of lens elements and the fourth group of lens elements are rotated by 60° relative to each other about the optical axis.

Here, the crystal axes optically equivalent to the crystal axis [111] are the crystal axes [-111], [1-11] and [11-1].

In this second method of the present invention, the fact that the third group of lens elements and the fourth group of lens elements have a positional relationship rotated substantially 60° about the optical axis relative to each other means that the relative angle about the optical axis between a predetermined crystal axis (e.g., crystal axis [-111], [11-1] or [1-11]) pointing in a direction differing from the optical axis in the third group of lens elements and the fourth group of lens elements is substantially 60°. For example, the relative angle about the optical axis between the crystal axis [-111] in the third group of lens elements and the crystal axis [-111] in the fourth group of lens elements is 60°.

In addition, as can be seen from FIGS. 3a and 3b, when the crystal axis [111] coincides with the optical axis, rotational asymmetry in the effects of birefringence centered about the optical axis appears with a period of 120°. Accordingly, in this second method, having a positional relationship rotated substantially 60° relative to each other about the optical axis means that the lens elements have a positional relationship rotated substantially 60°+(n*120°), that is to say 60°, 180°, 300°. . . , about the optical axis relative to each other (where n is an integer).

With this second method, it is preferable that the sum of the thicknesses of the first group of lens elements along the optical axis and the sum of the thicknesses of the second group of lens elements along the optical axis be substantially equal, and for the sum of the thicknesses of the third group of lens elements along the optical axis and the sum of the thicknesses of the fourth group of lens elements along the optical axis be substantially equal.

In addition, as shown in FIGS. 3a and 3b, the optical axis and the crystal axis of the lens elements are made to coincide, and consequently, an area corresponding to the crystal axes [110], [101] and [011] where the birefringence is a maximum exists at a 120° pitch, and the effects of birefringence having a distribution of 3θ in the pupil plane, that is, effects such as coma aberration being created in the image surface (wafer surface), appear. In contrast, as shown in FIGS. 4a and 4b, the optical axis and the crystal axis [100] of the lens elements are made to coincide, and consequently an area corresponding to the crystal axes [101], [10-1], [110] and [-101] where the birefringence is a maximum exists at a 90° pitch, and the effects of birefringence having a distribution of 4θ in the pupil plane appear.

In this case, vertical and horizontal patterns are dominant in the patterns that should be projected onto the wafer, and hence if there is a 4θ distribution, there are no effects such as the occurrence of astigmatism with respect to the vertical and horizontal patterns, and collapsing of the image is not significant. Accordingly, by employing a third method in which the optical axis and the crystal axis [100] (or a crystal axis optically equivalent to the crystal axis [100]) of at least one of the lens elements out of the plurality of lens elements 34–39 in the projection optical system are made to coincide, it is possible to attain good imaging performance while effectively mitigating the effects of birefringence.

In addition, as a fourth method in the first embodiment, out of the plurality of lens elements 34–39 in the projection optical system 41, the optical axis of a fifth group of lens elements is made to coincide with the crystal axis [110] (or a crystal axis optically equivalent to the crystal axis [110]), the optical axis of a sixth group of lens elements is made to coincide with the crystal axis [110] (or a crystal axis optically equivalent to the crystal axis [110]), and the fifth group of lens elements and the sixth group of lens elements are rotated by 90° relative to each other about the optical axis. Here, the crystal axes optically equivalent to the crystal axis [110] are the crystal axes [-110], [101], [-101], [011] and [01-1].

Figure 5C:
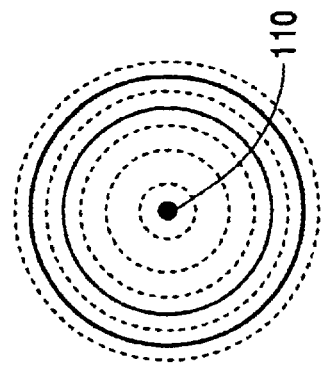
FIG. 5 (FIGS. 5a–c) explains the fourth method of the present invention, and shows the distribution of indices of birefringence with respect to the angle of incidence of the light beams.
Figure 5B:
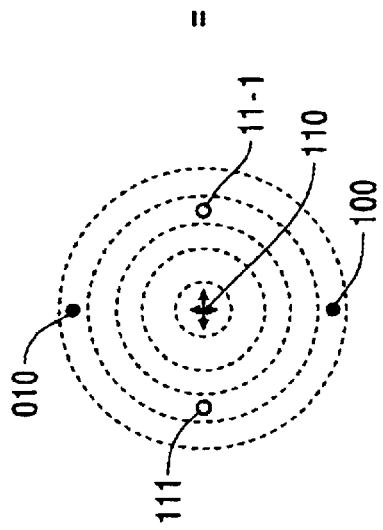
Figure 5A:
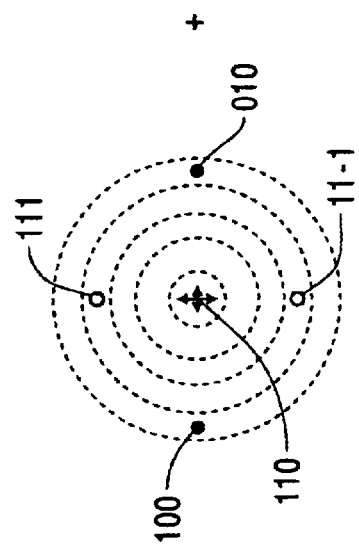

FIG. 5 is a drawing explaining the fourth method of the present invention, and shows the distribution of indices of birefringence with respect to the angle of incidence of the light beam. With this fourth method, the distribution of indices of birefringence in the fifth group of lens elements is as shown in FIG. 5a, and the distribution of indices of birefringence in the sixth group of lens elements is as shown in FIG. 5b. As a result, the distribution of indices of birefringence in the fifth group of lens elements and sixth group of lens elements together becomes as is shown in FIG. 5c.

As shown in FIGS. 5a and 5b, with this fourth method, the area corresponding to the crystal axis [110] that coincides with the optical axis becomes an area of birefringence with a relatively high refractive index with respect to polarization in one direction and a relatively low refractive index with respect to polarization in the other direction (the direction orthogonal to the first direction). In addition, the areas corresponding to the crystal axes [100] and [010] become areas of no birefringence with a relatively high refractive index. Furthermore, the areas corresponding to the crystal axes [111] and [11-1] become areas of no birefringence having a relatively low refractive index.

On the other hand, as shown in FIG. 5c, by rotating the fifth group of lens elements and the sixth group of lens elements 90° relative to each other about the optical axis, in the fifth group of lens elements and sixth group of lens elements as a whole, there are substantially no effects of the crystal axis [110] where birefringence is a maximum, and the area near the optical axis becomes an area of no birefringence having an intermediate index of refraction. That is to say, by employing the fourth method, it is possible in effect to receive none of the effects of birefringence and to attain good imaging performance.

In this fourth method of the present invention, the fact that the fifth group of lens elements and the sixth group of lens elements have a positional relationship rotated substantially 90° about the optical axis relative to each other means that the relative angle about the optical axis between a predetermined crystal axis (e.g., crystal axis [001], [-111], [-110] or [1-11]) pointing in a direction differing from the optical axis in the fifth group of lens elements and the sixth group of lens elements is substantially 90°. For example, the relative angle about the optical axis between the crystal axis [001] in the fifth group of lens elements and the crystal axis [001] in the sixth group of lens elements is 90°.

In addition, as can be seen from FIGS. 5a and 5b, when the crystal axis [110] coincides with the optical axis, rotational asymmetry in the effects of birefringence centered about the optical axis appears with a period of 180°. Accordingly, in this fourth method, having a positional relationship rotated substantially 90° relative to each other about the optical axis means that the lens elements have a positional relationship rotated substantially 90°+(n*180°), that is to say 90°, 270°. . . , about the optical axis relative to each other (where n is an integer).

In this fourth method, it is preferable that the sum of the thicknesses of the fifth group of lens elements along the optical axis and the sum of the thicknesses of the sixth group of lens elements along the optical axis be substantially equal. In particular, with this fourth method, the birefringent area is in the center (the optical axis and close thereto), so it is preferably applied to a negative lens having a thin center region.

In the first embodiment, it is possible to apply one of the methods appropriately selected from the first through fourth methods. In addition, it is also possible to apply these methods by combining a plurality of methods selected from these four. Thus, with the first embodiment, it is possible to realize a projection optical system having good imaging performance in effect without receiving the effects of birefringence, regardless of whether a birefringent optical material such as fluorite is used in the dioptric type projection optical system.

Figure 6:
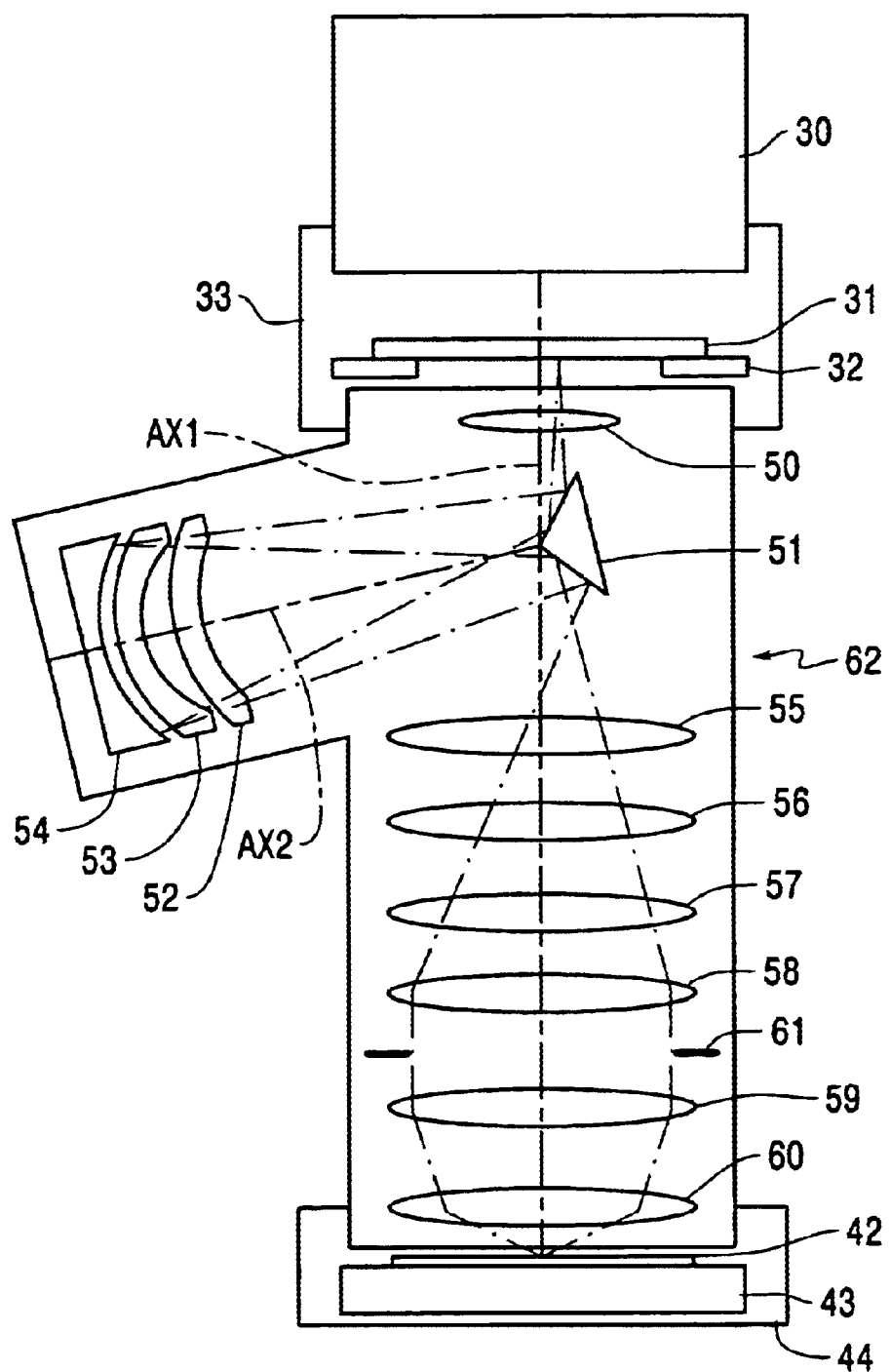
FIG. 6 is a diagram schematically showing the composition of an exposure apparatus provided with an optical system according to a second embodiment of the present invention.

FIG. 6 is a diagram schematically showing the composition of an exposure apparatus provided with an optical system according to a second embodiment of the present invention. In the second embodiment, the present invention is applied to a scanning projection exposure apparatus provided with a catadioptric type projection optical system. As shown in FIG. 6, the exposure apparatus of the second embodiment is provided with an illumination apparatus 30 for illuminating a reticle (mask) 31, the same as in the first embodiment.

The illumination apparatus 30 has a light source provided with an $F_2$ laser that supplies light having a wavelength of 157 nm, an optical integrator that forms a secondary light source of predetermined shape (circular, annular, bipolar, quadrupolar or the like) from the light from the light source, and an illumination field aperture stop for restricting the illumination area on the reticle 31, and illuminates the illumination area on the reticle 31 with a near uniform intensity distribution.

The illumination optical path within the illumination apparatus 30 is preferably purged with an inert gas, and in the present embodiment is purged with nitrogen. The reticle 31 is mounted on a reticle stage 32, and the reticle 31 and reticle stage 32 are isolated from the outside atmosphere by a casing 33. It is preferable to purge the space inside this casing 33 with an inert gas also, and in the present embodiment this space is purged with nitrogen.

Light from the reticle 31 that has been illuminated by the illumination apparatus 30 is guided to a wafer 42, as a photosensitive substrate, via a catadioptric type projection optical system 62. The projection optical system 62 has a first imaging optical system (50–54) that forms an intermediate image of the pattern on the reticle 31 on the basis of light from the reticle 31, and a second imaging optical system (55–61) that re-images the image (final image) of the intermediate image on the basis of light from this intermediate image, within an exposure area on a wafer 42.

The first imaging optical system (50–54) is provided with a lens element 50 arranged along a first optical axis AX1, an optical path folding mirror 51 having a reflective surface that reflects light that has passed through the lens element 50, lens elements 52 and 53 arranged along a second optical axis AX2 intersecting the first optical axis AX1 at a predetermined angle (e.g., 90–135°), and a concave reflective mirror 54.

In the first imaging optical system (50–54), light reflected by the reflective surface of the optical path folding mirror 51 is reflected by the concave reflective mirror 54 after passing through the lens elements 52 and 53, again passes through the lens elements 53 and 52, and is directed toward the other reflective surface of the optical path folding mirror 51. Furthermore, an intermediate image of the pattern on the reticle 31 is formed near the other reflective surface of this optical path folding mirror 51.

The second imaging optical system (55–61) has a plurality of lens elements 55–60 arranged along the first optical axis AX1, and an aperture stop 61 for controlling the coherence factor (σ value), and forms a secondary image (final image) of the pattern on the reticle 31 within the exposure area on the wafer 42 on the basis of light from the intermediate image formed by the first imaging optical system (50–54). This kind of projection optical system has been disclosed for example in FIG. 5 of U.S. Pat. No. 5,805,334 and European Patent Application No. 0989434A2. The disclosures of U.S. Pat. No. 5,805,334 and European Patent Application No. 0989434A2 are incorporated herein by reference in their entireties.

It is preferable for the projection optical path in this projection optical system 62 to be purged with an inert gas, and in the present embodiment this is purged with helium. The wafer 42 is mounted on a wafer stage 43, and the wafer 42 and wafer stage 43 are isolated from the outside atmosphere by a casing 44. It is preferable to purge the space inside this casing 44 with an inert gas, and in the present embodiment this space is purged with nitrogen.

Furthermore, the reticle stage 32 and wafer stage 43 are moved relative to the projection optical system 62 at a speed ratio in accordance with the magnification of the projection optical system 62, and the pattern on the reticle 31 is transferred to the exposure area on the wafer 42 by illuminating the reticle 31.

In this second embodiment, the plurality of lens elements 50, 52, 53 and 55–60 in the catadioptric type projection optical system are made of fluorite (calcium fluoride). Accordingly, in this second embodiment also it is possible to employ one method appropriately selected from the first through fourth methods explained in the first embodiment. In addition, it is also possible to employ a combination of the plurality of methods selected from these four methods. Thus, with the second embodiment, it is possible in effect to realize a projection optical system having good imaging performance without receiving the effects of birefringence, regardless of whether a birefringent optical material such as fluorite is used in the catadioptric type projection optical system, the same as with the first embodiment. In this second embodiment, when the fourth method is employed in the two negative lens elements 52 and 53 functioning as refractive optical members arranged in the bi-directional optical path formed by the concave reflective mirror 54, still better results are obtained because with this fourth method the birefringent area is in the center (the optical axis or close thereto).

In each of the embodiments discussed above, calcium fluoride crystals (fluorite) are used as the optical material with birefringence, but this is intended to be illustrative and not limiting, for it is also possible to use other single-axis crystals, for example barium fluoride crystals ($BaF_2$), lithium fluoride crystals (LiF), sodium fluoride crystals (NaF), strontium fluoride crystals ($SrF_2$), beryllium fluoride crystals ($BeF_2$) or the like, or other crystal materials that are transmissive with respect to ultraviolet rays. In this case, it is preferable for the crystal axis direction of barium fluoride ($BaF_2$) or the like to be set in accordance with the present invention.

In the exposure apparatus of each of the above-described embodiments, it is possible to manufacture a microdevice (semiconductor device, imaging device, liquid crystal display device, thin film magnetic head, or the like) by illuminating a reticle (mask) with the illumination apparatus (illumination process), and by using the projection optical system to expose a photosensitive substrate with an image of the pattern formed on the mask (exposure process). Below, one example is explained of a method used to obtain a semiconductor device as a microdevice by forming a predetermined circuit pattern on a wafer or the like serving as a photosensitive substrate using the exposure apparatus of any of the embodiments, with reference to the flowchart in FIG. 7.

Figure 7:
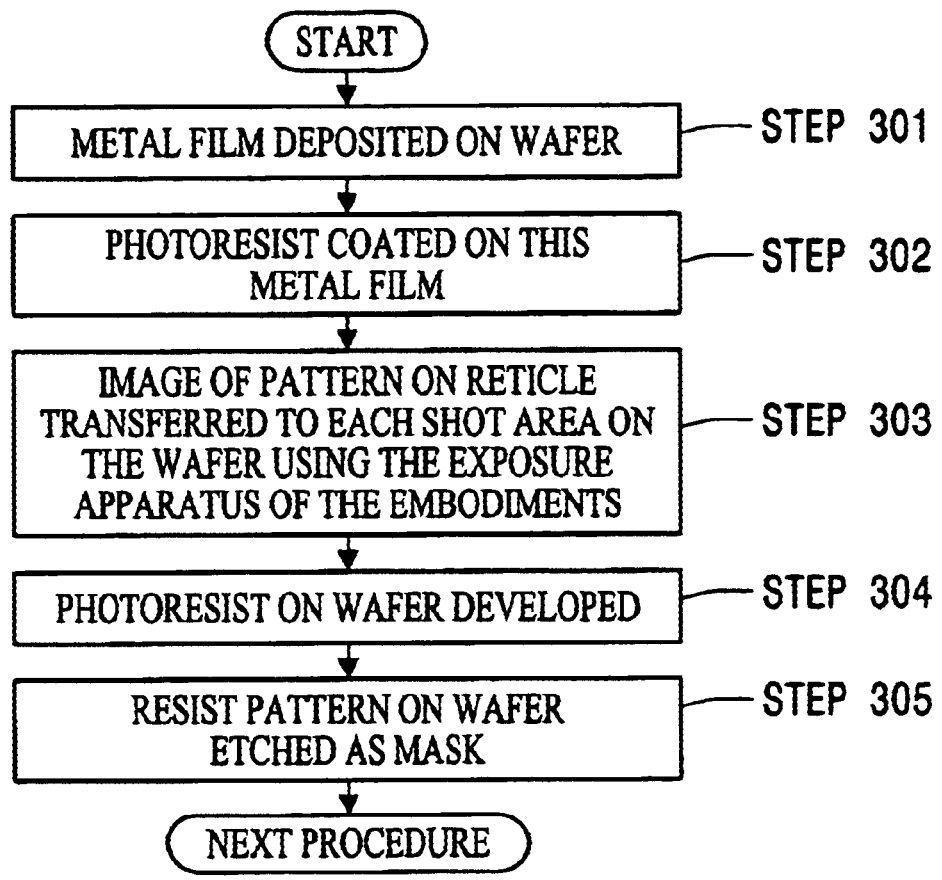
FIG. 7 is a flowchart for a method used to obtain a semiconductor device as a microdevice.

First, in step 301 in FIG. 7, a metal film is deposited onto one lot of wafers. In the subsequent step 302, a photoresist is coated on the metal film on this lot of wafers. Following this, in step 303, an image of the pattern on the mask is successively transferred and exposed onto each shot area on the lot of wafers via the projection optical system, using the exposure apparatus of any of the embodiments. Following this, in step 304, the photoresist on the lot of wafers is developed, after which in step 305 a circuit pattern corresponding to the pattern on the mask is formed on each shot area of each wafer by etching the resist pattern as a mask on the wafer lot.

After this, a device such as a semiconductor device or the like is fabricated by further accomplishing formation of circuit patterns on successive layers. Through the above-described semiconductor device fabrication method, it is possible to obtain good throughput of semiconductor devices having extremely fine circuit patterns. In steps 301 through 305, metal is deposited on the wafer, the metal film is coated with resist, and the various processes of exposure, developing and etching are accomplished, but naturally it would also be acceptable to form a silicon oxide film on the wafer in advance of these processes, to coat this silicon oxide film with resist and then accomplish the various procedures of exposure, developing and etching.

Figure 8:
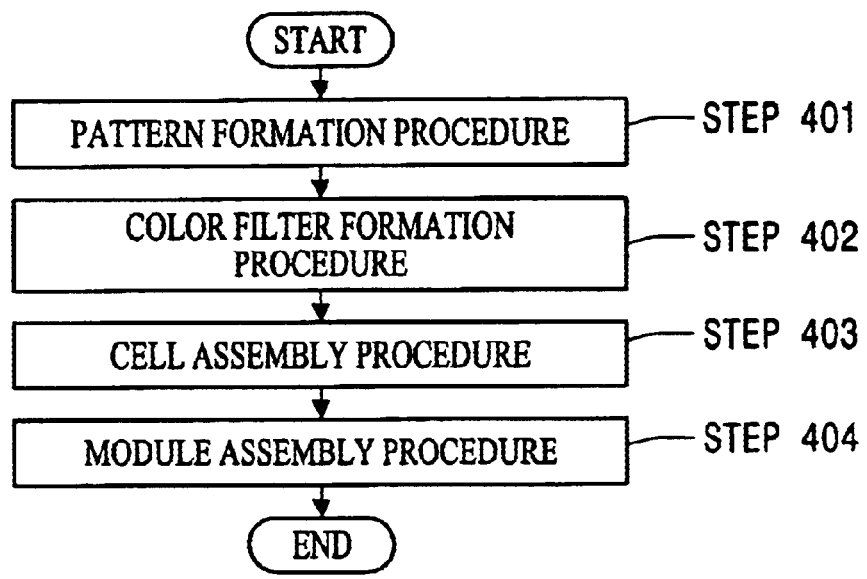
FIG. 8 is a flowchart for a method used to obtain a liquid crystal display device as a microdevice.

In addition, with the exposure apparatus of each of the embodiments, it is also possible to obtain a liquid crystal display device as a microdevice by forming a predetermined pattern (circuit pattern, electrode pattern or the like) on a plate (glass substrate). Below, one example of such a method is explained, with reference to the flowchart in FIG. 8. In FIG. 8, in pattern formation procedure 401, a so-called optical lithography procedure is accomplished in which the mask pattern is transferred and exposed onto a photosensitive substrate (a glass substrate or the like coated with resist) using the exposure apparatus of any of the embodiments. Through this optical lithography procedure, a predetermined pattern containing multiple electrodes or the like is formed on the photosensitive substrate. Following this, the predetermined pattern is formed on the substrate through various procedures by having the exposed substrate undergo a developing process, an etching process, a mask removal process and the like, after which the color filter formation procedure 402 is accomplished.

In the color filter formation procedure 402, a color filter is formed in which a plurality of groups of three dots corresponding to R (red), G (green) and B (blue) are arrayed in a matrix shape, or a plurality of groups of filters of R, G and B stripes are arrayed in a horizontal scanning line direction. Furthermore, after the color filter formation procedure 402, a cell assembly procedure 403 is accomplished. In the cell assembly procedure 403, a liquid crystal panel (liquid crystal cell) is assembled using the substrate having the predetermined pattern obtained in the pattern formation procedure 401 and the color filter obtained in the color filter formation procedure 402. In the cell assembly procedure 403, a liquid crystal panel (liquid crystal cell) is produced by injecting a liquid crystal material, for example, between the substrate having the predetermined pattern obtained in the pattern formation procedure 401, and the color filter obtained in the color filter formation procedure 402.

Following this, in the module assembly procedure 404, the liquid crystal display device is finished by attaching various parts including a backlight and electric circuits that cause the display action of the assembled liquid crystal panel (liquid crystal cell). Through the above-described liquid crystal display device production method, it is possible to obtain good throughput of liquid crystal display devices having extremely fine circuit patterns.

In each of the above-described embodiments, the present invention is applied to a projection optical system mounted in an exposure apparatus, but this is intended to be illustrative and not limiting, for the present invention may also be applied to other general optical systems. In addition, in each of the above-described embodiment, an $F_2$ laser light source that supplies light having a wavelength of 157 nm was used, but this is intended to be illustrative and not limiting, for it also is possible to use, for example, an ArF excimer laser light source supplying light having a wavelength of 193 nm or an $Ar_2$ laser light source supplying light having a wavelength of 126 nm.

As explained above, with the present invention, it is possible to realize an optical system having good optical performance without receiving the effects of birefringence even when using an optical material having intrinsic birefringence such as fluorite, for example. Accordingly, by incorporating the optical system of the present invention into an exposure apparatus, it is possible to fabricate good microdevices through high precision projection exposure via a high resolution projection optical system.

While the invention has been described with reference to preferred embodiments thereof, it is to be understood that the invention is not limited to the preferred embodiments or constructions. To the contrary, the invention is intended to cover various modifications and equivalent arrangements conceivable by those skilled in lithographic systems. In addition, while the various elements of the preferred embodiments are shown in various combinations and configurations, which are exemplary, other combinations and configurations, including more, less or only a single element, are also within the spirit and scope of the invention.

What is claimed is:

1. A projection optical system that projects an image of a pattern formed on a first surface onto a second surface, comprising:

a first group of radiation transmissive members, the first group of radiation transmissive members transmitting light having a wavelength of 200 nm or less, being formed of a crystal material, and having an optical axis that substantially coincides with one of a crystal axis and a crystal axis optically equivalent to the crystal axis of the crystal material;

a second group of radiation transmissive members, the second group of radiation transmissive members transmitting light having a wavelength of 200 nm or less, being formed of a crystal material, and having an optical axis that substantially coincides with one of a crystal axis and a crystal axis optically equivalent to the crystal axis of the crystal material;

a third group of radiation transmissive members, the third group of radiation transmissive members transmitting light having a wavelength of 200 nm or less, being formed of a crystal material, and having an optical axis that substantially coincides with one of a crystal axis and a crystal axis optically equivalent to the crystal axis of the crystal material; and a fourth group of radiation transmissive members, the fourth group of radiation transmissive members transmitting light having a wavelength of 200 nm or less, being formed of a crystal material, and having an optical axis that substantially coincides with one of a crystal axis and a crystal axis optically equivalent to the crystal axis of the crystal material, wherein the first group of radiation transmissive members and the second group of radiation transmissive members have a positional relationship rotated substantially 45° about the optical axis relative to each other, and wherein the third group of radiation transmissive members and the fourth group of radiation transmissive members have a positional relationship rotated substantially 60° about the optical axis relative to each other.

2. An exposure apparatus for transferring a pattern formed on a mask onto a photosensitive substrate, comprising:

a light source;

an illumination system which is arranged in an optical path between the light source and the mask and which illuminates the mask; and a projection optical system which is arranged in an optical path between the mask and the photosensitive substrate, and which projects an image of the pattern formed on the mask onto the photosensitive substrate;

wherein optical members are arranged in an optical path between the light source and the photosensitive substrate, the optical members comprising:

a first group of radiation transmissive members, the first group of radiation transmissive members transmitting light having a wavelength of 200 nm or less, being formed of a crystal material, and having an optical axis that substantially coincides with one of a crystal axis and a crystal axis optically equivalent to the crystal axis of the crystal material;

a second group of radiation transmissive members, the second group of radiation transmissive members transmitting light having a wavelength of 200 nm or less, being formed of a crystal material, and having an optical axis that substantially coincides with one of a crystal axis and a crystal axis optically equivalent to the crystal axis of the crystal material;

a third group of radiation transmissive members, the third group of radiation transmissive members transmitting light having a wavelength of 200 nm or less, being formed of a crystal material, and having an optical axis that substantially coincides with one of a crystal axis and a crystal axis optically equivalent to the crystal axis of the crystal material; and a fourth group of radiation transmissive members, the fourth group of radiation transmissive members transmitting light having a wavelength of 200 nm or less, being formed of a crystal material, and having an optical axis that substantially coincides with one of a crystal axis and a crystal axis optically equivalent to the crystal axis of the crystal material, wherein the first group of radiation transmissive members and the second group of radiation transmissive members have a positional relationship rotated substantially 45° about the optical axis relative to each other, and wherein the third group of radiation transmissive members and the fourth group of radiation transmissive members have a positional relationship rotated substantially 60° about the optical axis relative to each other.

3. The exposure apparatus according to claim 2, wherein the projection optical system has the first, second, third and fourth groups of radiation transmissive members.

4. An exposure method for transferring a pattern formed on a mask onto a photosensitive substrate, comprising:

supplying an exposure light from a light source;

illuminating the mask with the exposure light; and projecting an image of the pattern formed on the mask onto the photosensitive substrate;

wherein optical members are arranged in an optical path between the light source and the photosensitive substrate, the optical members comprising:

a first group of radiation transmissive members, the first group of radiation transmissive members transmitting light having a wavelength of 200 nm or less, being formed of a crystal material, and having an optical axis that substantially coincides with one of a crystal axis and a crystal axis optically equivalent to the crystal axis of the crystal material;

a second group of radiation transmissive members, the second group of radiation transmissive members transmitting light having a wavelength of 200 nm or less, being formed of a crystal material, and having an optical axis that substantially coincides with one of a crystal axis and a crystal axis optically equivalent to the crystal axis of the crystal material;

a third group of radiation transmissive members, the third group of radiation transmissive members transmitting light having a wavelength of 200 nm or less, being formed of a crystal material, and having an optical axis that substantially coincides with one of a crystal axis and a crystal axis optically equivalent to the crystal axis of the crystal material; and a fourth group of radiation transmissive members, the fourth group of radiation transmissive members transmitting light having a wavelength of 200 nm or less, being formed of a crystal material, and having an optical axis that substantially coincides with one of a crystal axis and a crystal axis optically equivalent to the crystal axis of the crystal material, wherein the first group of radiation transmissive members and the second group of radiation transmissive members have a positional relationship rotated substantially 45° about the optical axis relative to each other, and wherein the third group of radiation transmissive members and the fourth group of radiation transmissive members have a positional relationship rotated substantially 60° about the optical axis relative to each other.

5. The exposure method according to claim 4, wherein the projection optical system has the first, second third and fourth groups of radiation transmissive members.

6. An exposure apparatus for transferring a pattern formed on a mask onto a photosensitive substrate, comprising:

a light source;

an illumination system arranged in an optical path between the light source and the mask, wherein the illumination system illuminates the mask; and a projection optical system arranged in an optical path between the mask and the photosensitive substrate, wherein the projection optical system projects an image of the pattern formed on the mask onto the photosensitive substrate, wherein optical members are arranged in an optical path between the light source and the photosensitive substrate, the optical members comprising:

a first group of radiation transmissive members, the first group of radiation transmissive members transmitting light having a wavelength of 200 nm or less, being formed of a crystal material, and having an optical axis that substantially coincides with one of a crystal axis and a crystal axis optically equivalent to the crystal axis of the crystal material;

a second group of radiation transmissive members, the second group of radiation transmissive members transmitting light having a wavelength of 200 nm or less, being formed of a crystal material, and having an optical axis that substantially coincides with one of a crystal axis and a crystal axis optically equivalent to the crystal axis of the crystal material;

a third group of radiation transmissive members, the third group of radiation transmissive members transmitting light having a wavelength of 200 nm or less, being formed of a crystal material, and having an optical axis that substantially coincides with one of a crystal axis and a crystal axis optically equivalent to the crystal axis of the crystal material;

a fourth group of radiation transmissive members, the fourth group of radiation transmissive members transmitting light having a wavelength of 200 nm or less, being formed of a crystal material, and having an optical axis that substantially coincides with one of a crystal axis and a crystal axis optically equivalent to the crystal axis of the crystal material;

a fifth group of radiation transmissive members, the fifth group of radiation transmissive members transmitting light having a wavelength of 200 nm or less, being formed of a crystal material, and having an optical axis that substantially coincides with one of a crystal axis and a crystal axis optically equivalent to the crystal axis of the crystal material; and a sixth group of radiation transmissive members, the sixth group of radiation transmissive members transmitting light having a wavelength of 200 nm or less, being formed of a crystal material, and having an optical axis that substantially coincides with one of a crystal axis and a crystal axis optically equivalent to the crystal axis of the crystal material, wherein the first group of radiation transmissive members and the second group of radiation transmissive members have a positional relationship rotated substantially 45° about the optical axis relative to each other, wherein the third group of radiation transmissive members and the fourth group of radiation transmissive members have a positional relationship rotated substantially 90° about the optical axis relative to each other, and wherein the fifth group of radiation transmissive members and the sixth group of radiation transmissive members have a positional relationship rotated substantially 60° about the optical axis relative to each other.

7. An exposure method for transferring a pattern formed on a mask onto a photosensitive substrate, comprising:

supplying an exposure light from a light source;

illuminating the mask with the exposure light; and projecting an image of the pattern formed on the mask onto the photosensitive substrate;

wherein optical members are arranged in an optical path between the light source and the photosensitive substrate, the optical members comprising:

a first group of radiation transmissive members, the first group of radiation transmissive members transmitting light having a wavelength of 200 nm or less being formed of a crystal material, and having an optical axis that substantially coincides with one of a crystal axis and a crystal axis optically equivalent to the crystal axis of the crystal material;

a second group of radiation transmissive members, the second group of radiation transmissive members transmitting light having a wavelength of 200 nm or less, being formed of a crystal material, and having an optical axis that substantially coincides with one of a crystal axis and a crystal axis optically equivalent to the crystal axis of the crystal material;

a third group of radiation transmissive members, the third group of radiation transmissive members transmitting light having a wavelength of 200 nm or less, being formed of a crystal material, and having an optical axis that substantially coincides with one of a crystal axis and a crystal axis optically equivalent to the crystal axis of the crystal material;

a fourth group of radiation transmissive members, the fourth group of radiation transmissive members transmitting light having a wavelength of 200 nm or less, being formed of a crystal material and having an optical axis that substantially coincides with one of a crystal axis and a crystal axis optically equivalent to the crystal axis of the crystal material;

a fifth group of radiation transmissive members, the fifth group of radiation transmissive members transmitting light having a wavelength of 200 nm or less, being formed of a crystal material, and having an optical axis that substantially coincides with one of a crystal axis and a crystal axis optically equivalent to the crystal axis of the crystal material; and a sixth group of radiation transmissive members, the sixth group of radiation transmissive members transmitting light having a wavelength of 200 nm or less, being formed of a crystal material, and having an optical axis that substantially coincides with one of a crystal axis and a crystal axis optically equivalent to the crystal axis of the crystal material, wherein the first group of radiation transmissive members and the second group of radiation transmissive members have a positional relationship rotated substantially 45° about the optical axis relative to each other, wherein the third group of radiation transmissive members and the fourth group of radiation transmissive members have a positional relationship rotated substantially 90° about the optical axis relative to each other, and wherein the fifth group of radiation transmissive members and the sixth group of radiation transmissive members have a positional relationship rotated substantially 60° about the optical axis relative to each other.

8. An exposure method for transferring a pattern formed on a mask onto a photosensitive substrate, comprising:

supplying an exposure light from a light source;

illuminating the mask with the exposure light; and projecting an image of the pattern formed on the mask onto the photosensitive substrate;

wherein optical members are arranged in an optical path between the light source and the photosensitive substrate, the optical members comprising:

a first group of radiation transmissive members, the first group of radiation transmissive members transmitting light having a wavelength of 200 nm or less, being formed of a crystal material, and having an optical axis that substantially coincides with one of a crystal axis and a crystal axis optically equivalent to the crystal axis of the crystal material;

a second group of radiation transmissive members, the second group of radiation transmissive members transmitting light having a wavelength of 200 nm or less, being formed of a crystal material, and having an optical axis that substantially coincides with one of a crystal axis and a crystal axis optically equivalent to the crystal axis of the crystal material;

a third group of radiation transmissive members, the third group of radiation transmissive members transmitting light having a wavelength of 200 nm or less, being formed of a crystal material, and having an optical axis that substantially coincides with one of a crystal axis and a crystal axis optically equivalent to the crystal axis of the crystal material;

a fourth group of radiation transmissive members, the fourth group of radiation transmissive members transmitting light having a wavelength of 200 nm or less, being formed of a crystal material, and having an optical axis that substantially coincides with one of a crystal axis and a crystal axis optically equivalent to the crystal axis of the crystal material;

a fifth group of radiation transmissive members, the fifth group of radiation transmissive members transmitting light having a wavelength of 200 nm or less, being formed of a crystal material, and having an optical axis that substantially coincides with one of a crystal axis and a crystal axis optically equivalent to the crystal axis of the crystal material; and a sixth group of radiation transmissive members, the sixth group of radiation transmissive members transmitting light having a wavelength of 200 nm or less, being formed of a crystal material, and having an optical axis that substantially coincides with one of a crystal axis and a crystal axis optically equivalent to the crystal axis of the crystal material, wherein the first group of radiation transmissive members and the second group of radiation transmissive members have a positional relationship rotated substantially 45° about the optical axis relative to each other.

wherein the third group of radiation transmissive members and the fourth group of radiation transmissive members have a positional relationship rotated substantially 90° about the optical axis relative to each other, and wherein the fifth group of radiation transmissive members and the sixth group of radiation transmissive members have a positional relationship rotated substantially 60° about the optical axis relative to each other.

* * * * *